United States Patent
Lin

(10) Patent No.: US 11,300,587 B1
(45) Date of Patent: Apr. 12, 2022

(54) HIGH-FREQUENCY MEASUREMENT LINE STRUCTURE

(71) Applicant: WANSHIH ELECTRONIC CO., LTD., New Taipei (TW)

(72) Inventor: Hung-Hsuan Lin, New Taipei (TW)

(73) Assignee: WANSHIH ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 17/129,011

(22) Filed: Dec. 21, 2020

(51) Int. Cl.
*G01R 1/067* (2006.01)
*G01R 1/073* (2006.01)

(52) U.S. Cl.
CPC ..... *G01R 1/06772* (2013.01); *G01R 1/06766* (2013.01); *G01R 1/06788* (2013.01); *G01R 1/07342* (2013.01)

(58) Field of Classification Search
CPC ............ G01R 1/06772; G01R 1/06766; G01R 1/06788; G01R 1/07342
See application file for complete search history.

(56) References Cited

U.S. PATENT DOCUMENTS

| | | | | |
|---|---|---|---|---|
| 3,688,225 A * | 8/1972 | Cohn | ......................... | H01P 5/10 333/204 |
| 6,023,211 A * | 2/2000 | Somei | ................... | H05K 1/0251 333/246 |
| 2002/0011855 A1 * | 1/2002 | Heal | ................... | G01R 1/06772 324/755.02 |
| 2002/0084876 A1 * | 7/2002 | Wright | ................. | H05K 1/0253 333/238 |
| 2017/0141450 A1 * | 5/2017 | Bae | ......................... | H01P 3/081 |
| 2018/0299488 A1 * | 10/2018 | Jordan | ................. | H01Q 9/0407 |
| 2020/0303799 A1 * | 9/2020 | Wang | ...................... | H01P 3/082 |
| 2020/0344874 A1 * | 10/2020 | Asahi | ................... | H05K 1/0253 |

* cited by examiner

*Primary Examiner* — Paresh Patel
(74) *Attorney, Agent, or Firm* — Muncy, Geissler, Olds & Lowe, P.C.

(57) ABSTRACT

A high-frequency measurement line structure includes a circuit board structure and a multi-conductor transmission line section, a high-frequency measurement probe pad section and a transition section which are formed by the circuit board structure, wherein the transition section is arranged between the multi-conductor transmission line section and the high-frequency measurement probe pad section to be connected to the multi-conductor transmission line section and the high-frequency measurement probe pad section. The high-frequency measurement probe pad section includes a group of high-frequency measurement probe pads arranged on a first metal layer of the circuit board structure to touch a high-frequency probe to transmit a high-frequency signal. A second metal layer of the circuit board structure defines a slot arranged in accordance with the high-frequency measurement probe pad section and the transition section to help a mode conversion between the high-frequency probe and the multi-conductor transmission line section.

8 Claims, 8 Drawing Sheets

HIGH-FREQUENCY MEASUREMENT LINE STRUCTURE

BACKGROUND OF THE INVENTION

Field of the Invention

The present invention relates to a measurement line structure, and especially relates to a high-frequency measurement line structure.

Description of the Related Art

In the design and testing phases of the high-frequency components, the high-frequency probes are used to measure the high-frequency components. The most commonly used high-frequency probes are probes with the ground-signal-ground (usually referred to as GSG) arrangement, as shown in FIG. 3 (the high-frequency probe 20), wherein its operation mode can directly correspond to the related art co-planar waveguide (usually referred to as CPW) transmission line. FIG. 4 shows a sectional view of the related art co-planar waveguide field pattern mode.

The related art co-planar waveguide transmission line has the advantage of low loss at the high frequency. However, on many high-frequency substrates, many factors are considered, such as the substrate thickness and the multi-layer board integration, and so on, so that the related art microstrip and the related art grounded co-planar waveguide (usually referred to as GCPW) are commonly used transmission lines. FIG. 5 shows a sectional view of the related art microstrip field pattern mode and the related art grounded co-planar waveguide field pattern mode. The upper part of FIG. 5 shows the sectional view of the related art microstrip field pattern mode. The lower part of FIG. 5 shows the sectional view of the related art grounded co-planar waveguide field pattern mode. Especially in the millimeter wave frequency band, considering many factors, such as the radiation loss and the high-frequency signal coupling, and so on, the related art grounded co-planar waveguide is the most commonly used transmission line.

The structure of the related art grounded co-planar waveguide is similar to the structure of the related art co-planar waveguide, but the operation mode of the related art grounded co-planar waveguide is different from the operation mode of the related art co-planar waveguide. The operation mode of the related art grounded co-planar waveguide is similar to the operation mode of the related art microstrip, which more energy is stored in the substrate. Therefore, when using the probe with the ground-signal-ground arrangement to probe the transmission line of the related art grounded co-planar waveguide, the mode conversion loss and the impedance mismatch will be generated. Generally speaking, the higher the frequency, the more serious the above problems; the excessive reflection and loss will reduce the accuracy of the high-frequency measurement.

SUMMARY OF THE INVENTION

In order to solve the above-mentioned problems, an object of the present invention is to provide a high-frequency measurement line structure.

In order to achieve the object of the present invention mentioned above, the high-frequency measurement line structure of the present invention is applied to a high-frequency probe. The high-frequency measurement line structure includes a circuit board structure, a multi-conductor transmission line section, a high-frequency measurement probe pad section and a transition section. The multi-conductor transmission line section is formed by the circuit board structure. The high-frequency measurement probe pad section is formed by the circuit board structure. The transition section is formed by the circuit board structure. The transition section is arranged between the multi-conductor transmission line section and the high-frequency measurement probe pad section to be connected to the multi-conductor transmission line section and the high-frequency measurement probe pad section. Moreover, the circuit board structure includes a first metal layer, a second metal layer, a dielectric layer, and a plurality of via holes. The dielectric layer is arranged between the first metal layer and the second metal layer. The via holes are connected to the first metal layer and the second metal layer. Moreover, the high-frequency measurement probe pad section includes a group of high-frequency measurement probe pads arranged on the first metal layer to touch the high-frequency probe to transmit a high-frequency signal. The second metal layer defines a slot arranged in accordance with the high-frequency measurement probe pad section and the transition section to help a mode conversion between the high-frequency probe and the multi-conductor transmission line section.

Moreover, in an embodiment of the high-frequency measurement line structure of the present invention mentioned above, the circuit board structure is a multi-layer circuit board including, for example but not limited to, at least three metal layers.

Moreover, in an embodiment of the high-frequency measurement line structure of the present invention mentioned above, the group of high-frequency measurement probe pads is, for example but not limited to, a group of ground-signal-ground (usually referred to as GSG) arrangement probe pads.

Moreover, in an embodiment of the high-frequency measurement line structure of the present invention mentioned above, the multi-conductor transmission line section is, for example but not limited to, a grounded co-planar waveguide (usually referred to as GCPW) structure.

Moreover, in an embodiment of the high-frequency measurement line structure of the present invention mentioned above, the multi-conductor transmission line section is, for example but not limited to, a microstrip structure.

Moreover, in an embodiment of the high-frequency measurement line structure of the present invention mentioned above, the slot has a width. If the width of the slot is nearer the multi-conductor transmission line section, the width of the slot is narrower. If the width of the slot is nearer the high-frequency measurement probe pad section, the width of the slot is wider.

Moreover, in an embodiment of the high-frequency measurement line structure of the present invention mentioned above, the slot is, for example but not limited to, triangular.

Moreover, in an embodiment of the high-frequency measurement line structure of the present invention mentioned above, the high-frequency measurement probe pad section includes a part of the via holes connected to the first metal layer and the second metal layer.

The advantage of the present invention is to reduce the mode conversion loss to increase the accuracy of the high-frequency measurement.

Please refer to the detailed descriptions and figures of the present invention mentioned below for further understanding the technology, method and effect of the present invention achieving the predetermined purposes. It believes that the purposes, characteristic, and features of the present invention can be understood deeply and specifically. However, the figures are only for references and descriptions, but the present invention is not limited by the figures.

DETAILED DESCRIPTION OF THE INVENTION

Figure 1:
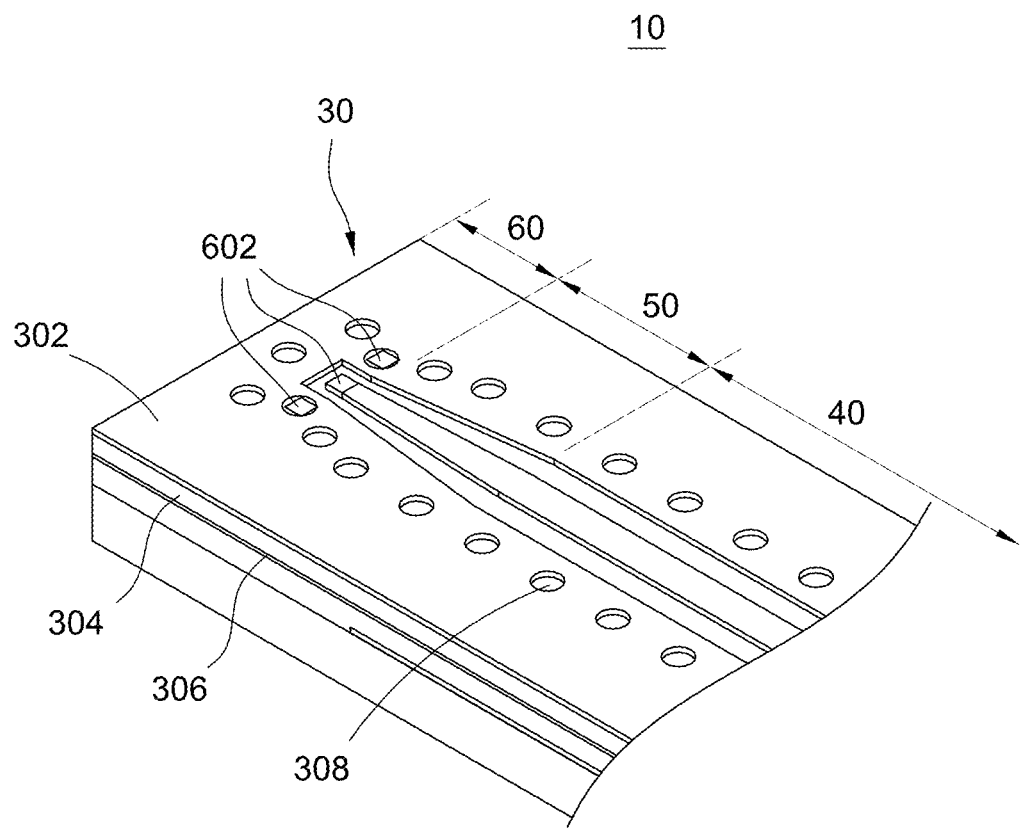
FIG. 1 shows a schematic diagram of an embodiment of the high-frequency measurement line structure of the present invention.
Figure 2:
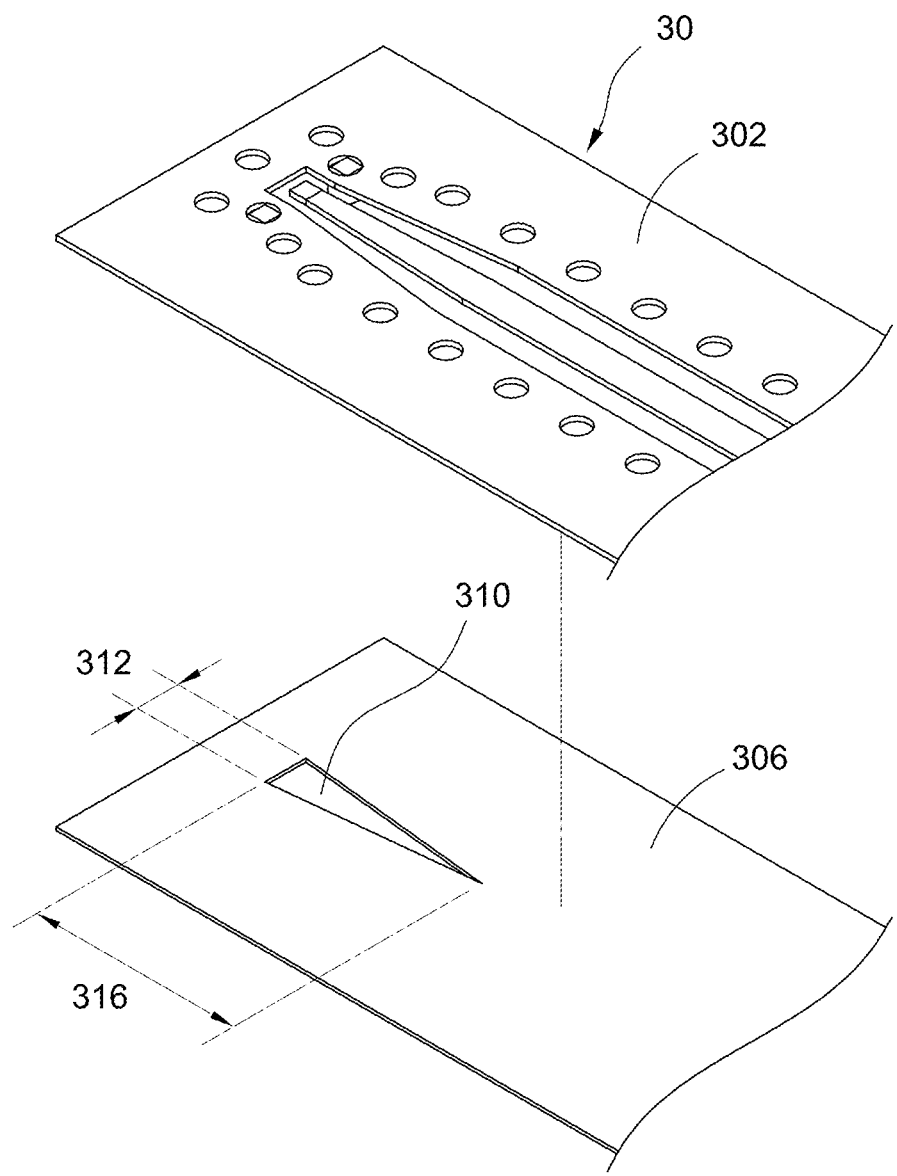
FIG. 2 shows an exploded view of an embodiment of the metal layers of the circuit board structure of the present invention.
Figure 3:
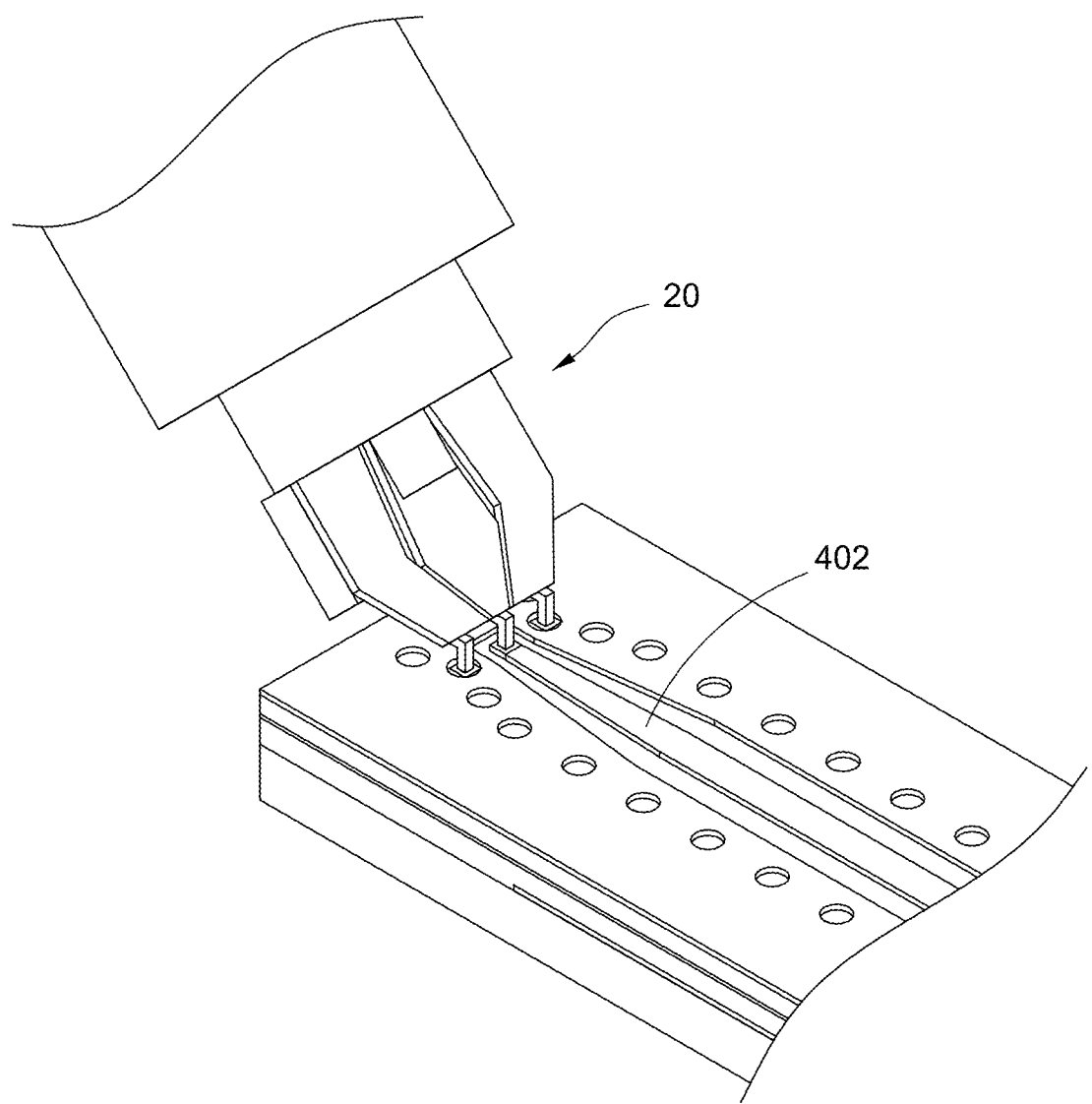
FIG. 3 shows a schematic diagram of an embodiment of the high-frequency measurement line structure of the present invention applied to a high-frequency probe.
Figure 4:
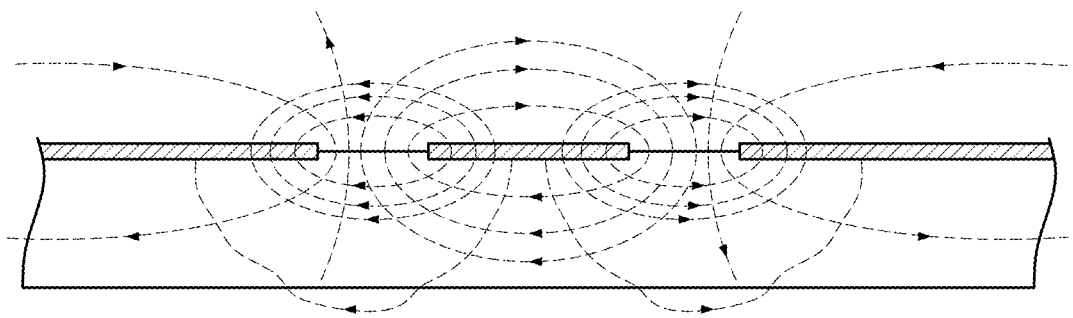
FIG. 4 shows a sectional view of the related art co-planar waveguide field pattern mode.
Figure 5:
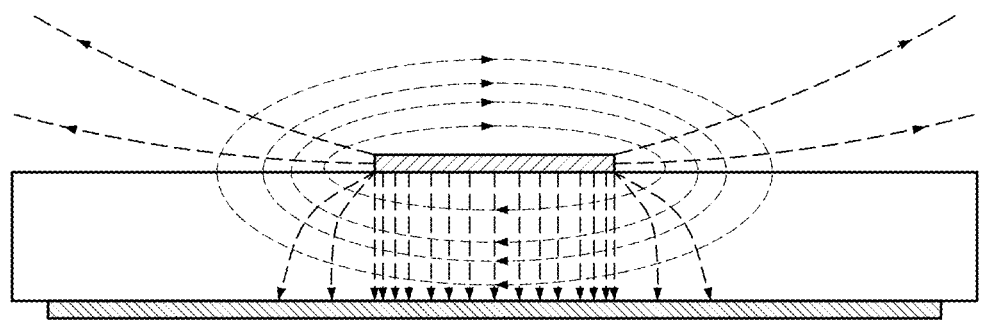
FIG. 5 shows a sectional view of the related art microstrip field pattern mode and the related art grounded co-planar waveguide field pattern mode.
Figure 5:
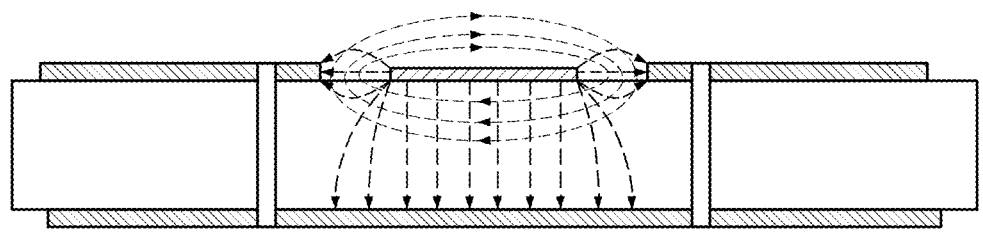

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 1 shows a schematic diagram of an embodiment of the high-frequency measurement line structure of the present invention. FIG. 2 shows an exploded view of an embodiment of the metal layers of the circuit board structure of the present invention. FIG. 3 shows a schematic diagram of an embodiment of the high-frequency measurement line structure of the present invention applied to a high-frequency probe. Please refer to FIG. 1, FIG. 2, and FIG. 3 at the same time. A high-frequency measurement line structure 10 of the present invention is applied to a high-frequency probe 20. The high-frequency measurement line structure 10 includes a circuit board structure 30, a multi-conductor transmission line section 40, a transition section 50, and a high-frequency measurement probe pad section 60. The multi-conductor transmission line section 40 is formed by the circuit board structure 30. The high-frequency measurement probe pad section 60 is formed by the circuit board structure 30. The transition section 50 is formed by the circuit board structure 30. The transition section 50 is arranged between the multi-conductor transmission line section 40 and the high-frequency measurement probe pad section 60 to be connected to the multi-conductor transmission line section 40 and the high-frequency measurement probe pad section 60. One should know that FIG. 1, FIG. 2, and FIG. 3 are merely partial schematic diagrams, and the right side of FIG. 1, FIG. 2 and FIG. 3 is connected to a high-frequency component (not shown in the figures) which is to be tested; for example, please refer to FIG. 9 or FIG. 10; the circuit board structure 30 is connected to the high-frequency component (not shown in the figures) which is to be tested through another high-frequency probe 20.

The circuit board structure 30 includes a first metal layer 302, a dielectric layer 304, a second metal layer 304 (for example, a ground layer) and a plurality of via holes 308. The dielectric layer 304 is arranged between the first metal layer 302 and the second metal layer 306. The via holes 308 are connected to the first metal layer 302 and the second metal layer 306. The high-frequency measurement probe pad section 60 includes a group of high-frequency measurement probe pads 602 arranged on the first metal layer 302 to touch the high-frequency probe 20 to transmit a high-frequency signal. The second metal layer 306 defines a slot 310 arranged in accordance with the high-frequency measurement probe pad section 60 and the transition section 50 to help a mode conversion between the high-frequency probe 20 and the multi-conductor transmission line section 40. One should know that the via holes 308 are not shown on the second metal layer 306 of FIG. 2 for brevity.

The circuit board structure 30 is a multi-layer circuit board including, for example but not limited to, at least three metal layers. The group of high-frequency measurement probe pads 602 is, for example but not limited to, a group of ground-signal-ground (usually referred to as GSG) arrangement probe pads. The multi-conductor transmission line section 40 is, for example but not limited to, a grounded co-planar waveguide (usually referred to as GCPW) structure or a microstrip structure. The slot 310 has a width 312. If the width 312 of the slot 310 is nearer the multi-conductor transmission line section 40, the width 312 of the slot 310 is narrower. If the width 312 of the slot 310 is nearer the high-frequency measurement probe pad section 60, the width 312 of the slot 310 is wider. The slot 310 is, for example but not limited to, triangular. The high-frequency measurement probe pad section 60 includes a part of the via holes 308 connected to the first metal layer 302 and the second metal layer 306.

Figure 8:
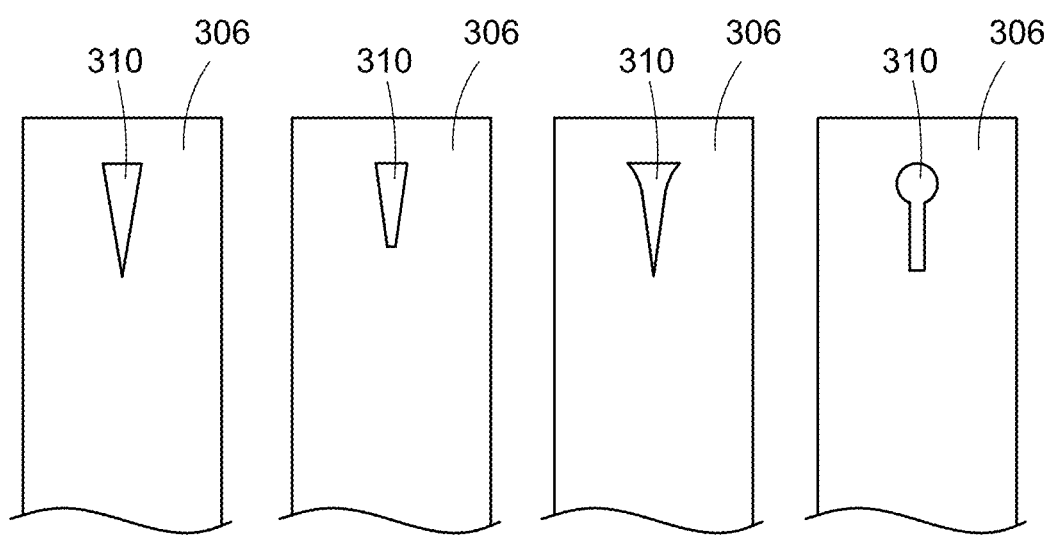
FIG. 8 shows a schematic diagram of various slots of the second metal layer of the present invention.

Moreover, FIG. 8 shows a schematic diagram of various slots of the second metal layer of the present invention. The slot 310 is, for example but not limited to, isosceles triangular, trapezoid, an area enclosed by arc/parabola/involute lines and straight lines, or keyhole-shaped. Basically, the part near the multi-conductor transmission line section 40 is narrow, and the part near the high-frequency measurement probe pad section 60 is wide, to achieve the purposes of adjusting the current distribution and the field pattern mode.

If the multi-conductor transmission line section 40 is the grounded co-planar waveguide structure, as shown in FIG. 3, the multi-conductor transmission line section 40 includes a grounded co-planar waveguide line 402, wherein the transmission line characteristic impedance of the grounded co-planar waveguide line 402 is generally designed as the standard impedance of the measurement system, to import or export the high-frequency signal of the high-frequency component which is to be tested. The size and the gap of the group of high-frequency measurement probe pads 602 of the high-frequency measurement probe pad section 60 measured by the high-frequency probe 20 needs to match the gap of the high-frequency probe 20. The transition section 50 is used to manage the gradation of the geometry and the impedance of the multi-conductor transmission line section 40 and the high-frequency measurement probe pad section 60. In some lower frequency applications, the transition section 50 may be omitted.

Figure 6:
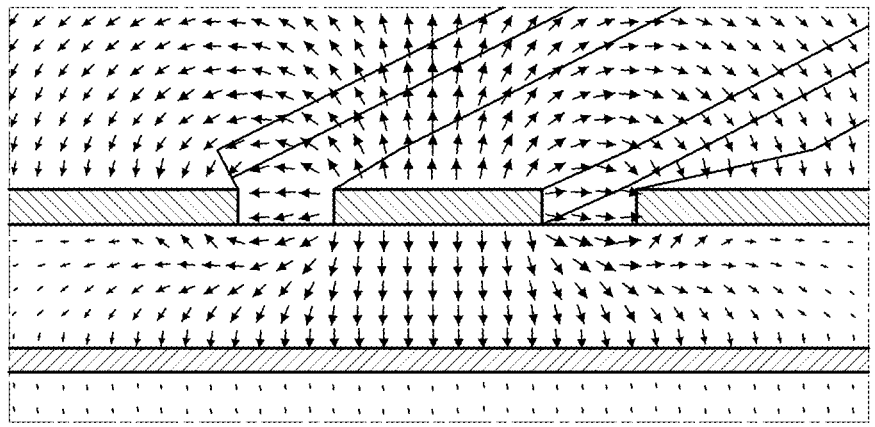
FIG. 6 shows a sectional view of the electric field vectors of the related art ground plane without a slot.

In an example, the second metal layer 306 is a complete ground plane (namely, without the slot 310), and the second metal layer 306 has the via holes 308 connected to the ground plane of the first metal layer 302. The ground plane of the second metal layer 306 is under the high-frequency measurement probe pad section 60, so the mode is still in the form of the grounded co-planar waveguide, and there is a lot of energy stored between the signal line and the ground plane of the second metal layer 306; since it cannot be converted into the co-planar waveguide mode of the ground-signal-ground probe, the impedance mismatch and the loss are generated. FIG. 6 shows a sectional view of the electric field vectors of the related art ground plane without a slot.

In another example, the ground plane of the second metal layer 306 under the high-frequency measurement probe pad section 60 and the ground plane of the second metal layer 306 under the transition section 50 are completely removed (or, the ground plane of the second metal layer 306 under the high-frequency measurement probe pad section 60 is completely removed, but the ground plane of the second metal layer 306 under the transition section 50 is partly (gradually) removed), so that it can be converted into the co-planar waveguide mode. However, the ground plane of the second metal layer 306 is removed largely, so the gap of the co-planar waveguide of the high-frequency measurement probe pad section 60 is limited by the manufacturing process and cannot be very narrow, so the high-frequency signals with more radiation loss are generated easily. Namely, due to the limitation of the manufacturing process of the printed circuit board, the lower limit of the gap between the same layer of metal is 3-4 mil. With the co-planar waveguide structure formed by this gap, the radiation leakage is generated easily at the continuity of the boundary portion of the ground plane of the second metal layer 306. Moreover, the location/position/space below the removed ground plane of the second metal layer 306 needs sufficient clearance area (including the thickness direction and the lateral direction) to avoid the high-frequency signal coupling and the reflection interference, which is against the test structure integrated in the system with the test coupon type, and/or which is against the design sensitive to the plate thickness. Considering the limitation of the process line width, the multi-layer board integration, the system integration, and so on, it is necessary to develop the high-frequency measurement line structure 10 that can balance the measurement performance and the demand space.

The high-frequency measurement line structure 10 of the present invention is a novel high-frequency measurement line structure design, which ingeniously designs the shape and the location/position of the slot 310 of the second metal layer 306, to effectively adjust the high-frequency signal mode, and to effectively reduce the requirement for the clearance area, and to effectively reduce the radiation loss and the coupling. The high-frequency measurement line structure 10 of the present invention includes the following features:

1. The slot 310 of the second metal layer 306 (the ground layer) correspondingly starts from the transition section 50 and correspondingly finishes at the high-frequency measurement probe pad section 60. The width 312 of the slot 310 is narrow-front-and-wide-back to help convert the field pattern between the grounded co-planar waveguide of the transmission line and the co-planar waveguide mode of the ground-signal-ground probe. The width 312 and a length 316 (as shown in FIG. 2) of the slot 310 may be optimized according to the required frequency band to obtain the better bandwidth characteristics.

2. The periphery of the slot 310 of the second metal layer 306 is surrounded by the via holes 308 connected to the first metal layer 302 and the second metal layer 306, so as to maintain the ground planes of each layers at the same potential, and prevent the high-frequency signal from leaking to the outside.

Figure 9:
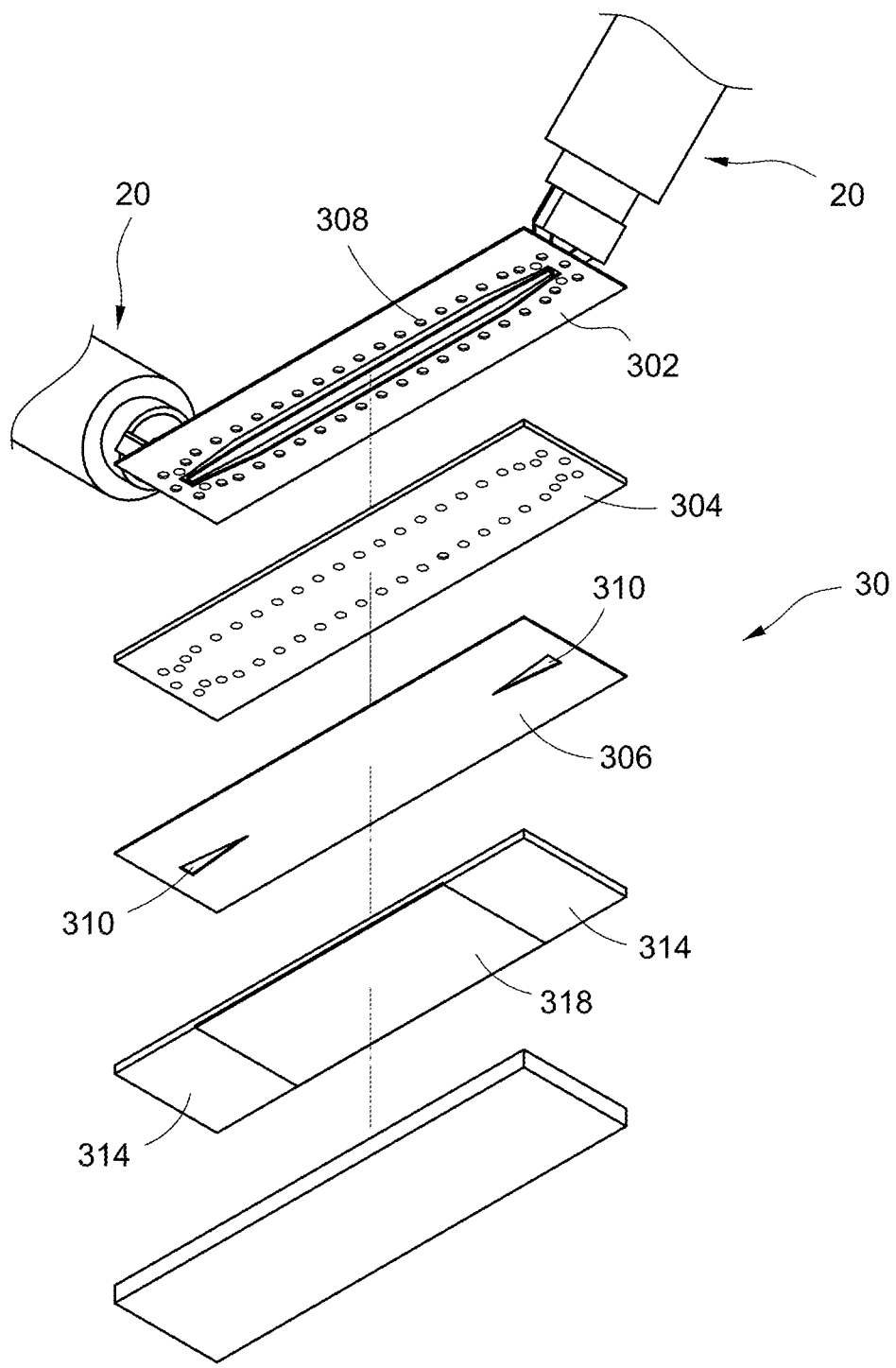
FIG. 9 shows an exploded view from a visual angle of another embodiment of the circuit board structure of the present invention.
Figure 10:
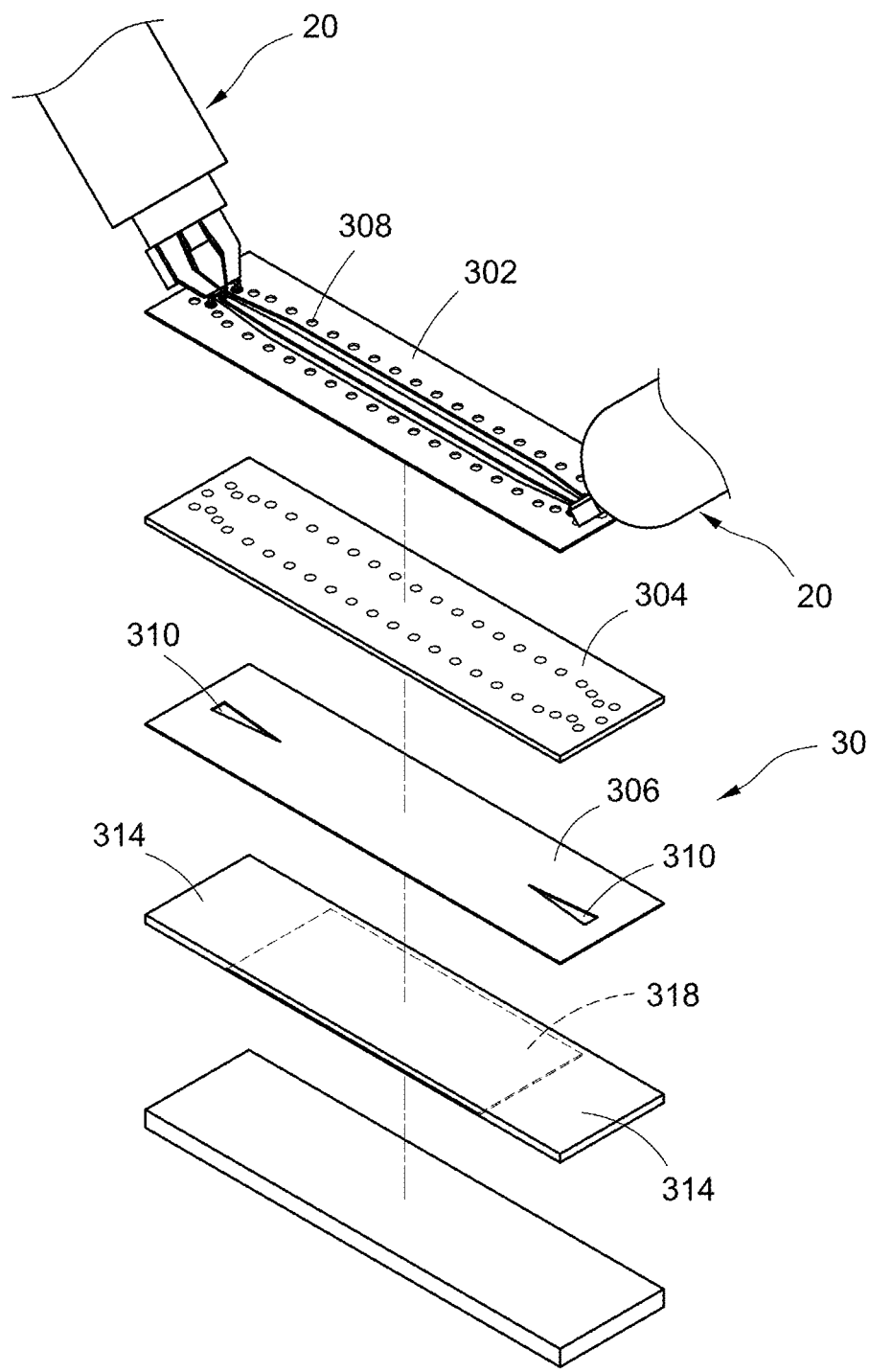
FIG. 10 shows an exploded view from another visual angle of another embodiment of the circuit board structure of the present invention.

3. FIG. 9 shows an exploded view from a visual angle of another embodiment of the circuit board structure of the present invention. FIG. 10 shows an exploded view from another visual angle of another embodiment of the circuit board structure of the present invention. The descriptions of the elements shown in FIG. 9 and FIG. 10 which are the same as the elements shown in the figures mentioned above are not repeated here for brevity. The circuit board structure 30 further includes a sub-dielectric layer 318 arranged below the second metal layer 306. The sub-dielectric layer 318 defines a clearance area 314 arranged below the slot 310 of the second metal layer 306 to prevent the high-frequency signal coupling. The clearance area 314 can be significantly reduced. Finally, the most suitable high-frequency measurement line structure under the conditions of the multi-layer board integration, the transmission performance, the radiation leakage/coupling and so on, is obtained.

Figure 7:
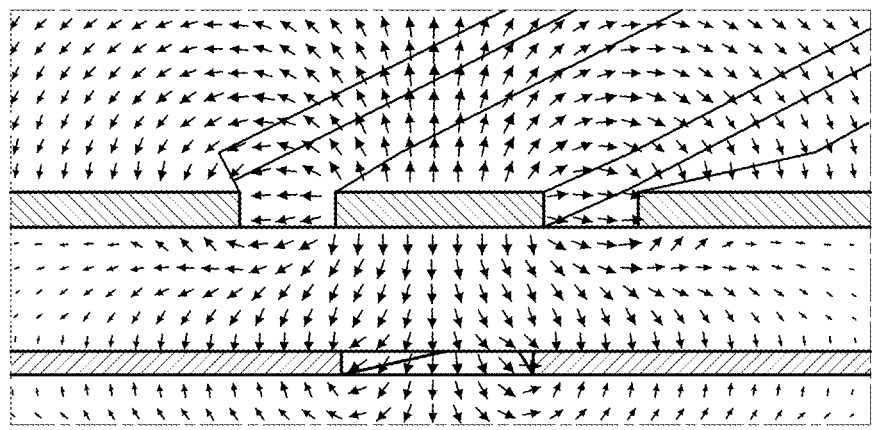
FIG. 7 shows a sectional view of the electric field vectors of the ground plane with a slot of the present invention.

Combining the above features, the high-frequency measurement line structure 10 of the present invention has excellent transmission characteristics, and is suitable for the application in the structure of the multi-layer circuit boards. FIG. 7 shows a sectional view of the electric field vectors of the ground plane with a slot of the present invention. The high-frequency measurement line structure 10 of the present invention retains the most of the ground plane of the second metal layer 306. The slot 310 is used to assist the mode conversion. As shown in FIG. 7, the electric field of the present invention is compared with the electric field of the design without a slot (FIG. 6) that the signal strength of the electric field of the present invention increases at the sides and above the middle signal lines, while below the middle signal lines, the signal strength of the electric field of the present invention is weakened, so that it more matches the mode of the high-frequency probe 20.

The advantage of the present invention is to reduce the mode conversion loss to increase the accuracy of the high-frequency measurement.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A high-frequency measurement line structure applied to a high-frequency probe, the high-frequency measurement line structure comprising:
    a circuit board structure;
    a multi-conductor transmission line section formed by the circuit board structure;
    a high-frequency measurement probe pad section formed by the circuit board structure; and a transition section formed by the circuit board structure, the transition section being arranged between the multi-conductor transmission line section and the high-frequency measurement probe pad section to be connected to the multi-conductor transmission line section and the high-frequency measurement probe pad section,
wherein the circuit board structure comprises:
a first metal layer;
a second metal layer;
a dielectric layer arranged between the first metal layer and the second metal layer; and
a plurality of via holes connected to the first metal layer and the second metal layer,
wherein the high-frequency measurement probe pad section comprises a group of high-frequency measurement probe pads arranged on the first metal layer to touch the high-frequency probe to transmit a high-frequency signal; the second metal layer defines a slot arranged in accordance with the high-frequency measurement probe pad section and the transition section to help a mode conversion between the high-frequency probe and the multi-conductor transmission line section;
wherein the circuit board structure further comprises a sub-dielectric layer arranged below the second metal layer; the sub-dielectric layer defines a clearance area arranged below the slot of the second metal layer.

2. The high-frequency measurement line structure in claim 1, wherein the circuit board structure is a multi-layer circuit board comprising at least three metal layers.

3. The high-frequency measurement line structure in claim 1, wherein the group of high-frequency measurement probe pads is a group of ground-signal-ground arrangement probe pads.

4. The high-frequency measurement line structure in claim 1, wherein the multi-conductor transmission line section is a grounded co-planar waveguide structure.

5. The high-frequency measurement line structure in claim 1, wherein the multi-conductor transmission line section is a microstrip structure.

6. The high-frequency measurement line structure in claim 1, wherein the slot has a width; if the width of the slot is nearer the multi-conductor transmission line section, the width of the slot is narrower; if the width of the slot is nearer the high-frequency measurement probe pad section, the width of the slot is wider.

7. The high-frequency measurement line structure in claim 1, wherein the slot is triangular.

8. The high-frequency measurement line structure in claim 1, wherein the high-frequency measurement probe pad section comprises a part of the via holes connected to the first metal layer and the second metal layer.

* * * * *